(12) United States Patent
Lenhard et al.

(10) Patent No.: US 7,268,363 B2
(45) Date of Patent: Sep. 11, 2007

(54) PHOTOSENSITIVE ORGANIC SEMICONDUCTOR COMPOSITIONS

(75) Inventors: Jerome R. Lenhard, Fairport, NY (US); Wayne T. Ferrar, Fairport, NY (US); Katrin Parsiegla, Fairport, NY (US); Bonnie R. Hein, Macedon, NY (US); Shiying Zheng, Webster, NY (US); Michel F. Molaire, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 179 days.

(21) Appl. No.: 11/058,014

(22) Filed: Feb. 15, 2005

(65) Prior Publication Data

US 2006/0180199 A1 Aug. 17, 2006

(51) Int. Cl.
*H01L 35/24* (2006.01)

(52) U.S. Cl. .................. 257/40; 257/184; 257/461; 257/E51.012

(58) Field of Classification Search ............. 136/263; 257/40, 184, 461, E51.012, E51.017
See application file for complete search history.

(56) References Cited

U.S. PATENT DOCUMENTS

| | | | |
|---|---|---|---|
| 4,968,571 A | 11/1990 | Gruenbaum et al. | |
| 5,019,473 A | 5/1991 | Nguyen et al. | |
| 5,196,144 A | 3/1993 | Smith et al. | |
| 5,333,183 A | 7/1994 | Herbert | |
| 5,454,880 A * | 10/1995 | Sariciftci et al. | 136/263 |
| 5,504,323 A | 4/1996 | Heeger et al. | |
| 5,523,555 A | 6/1996 | Friend et al. | |
| 5,614,342 A | 3/1997 | Molaire et al. | |
| 5,626,795 A | 5/1997 | Smith et al. | |
| 5,766,810 A | 6/1998 | Molaire et al. | |
| 5,968,416 A | 10/1999 | Smith et al. | |

OTHER PUBLICATIONS

U.S. Appl. No. 07/800,555, filed Nov. 27, 1991, Smith et al., *Optical Quality Transparent Conductors*.
C. W. Tang Appl. Phys. Lett. (1986) 48, pp. 183-185.
Peumans, P.; Yakimov, A.; Forrest. S. Journal of Applied Physics (2003), 93(7), pp. 3693-3723.
Petritsch, K.; Dittmer, J. J.; Marseglia, E. A.; Friend, R. H.; Lux, A.; Rozenberg, G. G.; Moratti, S. C.; Holmes, A. B., Solar Energy Materials and Solar Cells (2000), 61(1), pp. 63-72.
A. J. Heeger, The Journal Of Physical Chemistry B, (2001), 105, pp. 8475-8491.
T. A. Skotheim, Ed., Handbook of Conducting Polymers vol. 2nd edition- Marcel Dekker, New York 1998, Chapter 10, J. P. Ferraris and D. J. Guerrero, Recent Advances In Heteroaromatic Copolymers, pp. 259-276.

(Continued)

*Primary Examiner*—Minhloan Tran
*Assistant Examiner*—Benjamin Tzu-Hung Liu
(74) *Attorney, Agent, or Firm*—Lynne M. Blank

(57) ABSTRACT

The present invention relates to a photosensitive organic semiconductor composition comprising an organic p-type semiconductor pigment with a p-type conducting polymer, wherein the ionization potentials of the organic p-type semiconductor pigment and the p-type conducting polymer are nominally equivalent and a photosensitive organic semiconductor composition comprising an organic n-type semiconductor pigment with an n-type conducting polymer, wherein the electron affinities of the organic semiconductor pigment and the conducting polymer are nominally equivalent. The present invention also relates to a p/n heterojunction utilizing the photosensitive organic semiconductor compositions.

2 Claims, 4 Drawing Sheets

OTHER PUBLICATIONS

Grimsdale, A. C.; Cervini, R.; Friend, R. H.; Holmes, A. B.; Kim, S. T.; Moratti, S. C., Synthetic Metals (1997) pp. 1257-1258.

N. S. Sariciftci, L. Smilowitz, A. J. Heeger and F. Wudl, Science 258, pp. 1474-1476 (1992).

L. Smilowitz, N. S. Sariciftci, R. Wu, C. Gettinger, A. J. Heeger and F. Wudl, Physical Review B 47, pp. 13835-13842 (1993).

Hide, F.; Greenwald, Y.; Wudl, F; Heeger, A. J., Synthetic Metals 85, pp. 1255-1256 (1997).

G. Yu, C. Zhang, A. J. Heeger, Appl. Phys. Lett. 64, pp. 1540-1542 (1994).

Friend, R. H. Pure Appl. Chem. (2001) 73, pp. 425-430.

G. Yu, H. Pakbaz and A. J. Heeger, Appl. Phys. Lett. 64, pp. 3422-3424 (1994).

G. Yu, J. Gao, J. C. Hummelen, F. Wudl and A. J. Heeger, Science 270, pp. 1789-1791 (1995).

G. Yu and A. J. Heeger, J. Appl. Phys. 78, pp. 4510-4515 (1995).

Powell, R.; Soos, J.; Journal of Luminescence 11 (1975), pp. 1-45.

Meth, J.; Marshall, C.; Fayer, M.; Solid State Communications, (1990) 74, pp. 281-284.

Dittmer, J. J.; Lazzaroni, R.; Leclere, Ph.; Moretti, P.; Granstrom, M.; Petritsch, K.; Marseglia, E. A.; Friend, R. H.; Bredas, J. L.; Rost, H.; Holmes, A. B.; Solar Energy Materials and Solar Cells (2000), 61(1), pp. 53-61.

Gregg, B. J. Phys. Chem. (1996) 100, pp. 852-859.

Hor, A. M.; Loufty, R. O. Thin Solid Films 1983, 106, pp. 291-301.

Hong, J.; Chen, H; Wang, M., Journal of Material Science 2003, 38, pp. 4021-4025.

Anderson et al, J. Am. Chem. Soc. (1998), 120, pp. 9646-9655.

Kido, J.; Shionoya, H.; Nagai, K. Appl. Phys. Lett. (1995), 67, pp. 2281-2283.

Lee, S.; Wang, M.; Hou, X.; Tang, C., Applied Physics Letters (1999), 74, pp. 670-672.

Kimura, T.; Sumimoto, M.; Sakaki, S.; Fujimoto, H.; Hashimoto, Y.; Matsuzaki, S., Chemical Physics (2000), 253(1), pp. 125-131.

*Abstract of* Nobutsugu, M.; Kanji, S. Kobunshi Ronbunshu 1983, 40, 211-216.

*Abstract of* Manabu, T.; Satoshi, O.; Hiroyki, T.; Seiko, N.; Hideo, N. Tech. Dig.-Int. Photovoltaic Sci. and Eng. Conf., 1st (1984) pp. 263-266.

*Abstract of* Takashi, K.; Akira, K.; Shunji, I. Denshi Shashin Gakkaishi 1984, 23, 18-23.

\* cited by examiner

PHOTOSENSITIVE ORGANIC SEMICONDUCTOR COMPOSITIONS

FIELD OF THE INVENTION

The present invention relates to photosensitive organic semiconductor compositions.

BACKGROUND OF THE INVENTION

There is widespread interest in developing photosensitive organic semiconductor compositions for use in various optoelectronic devices, including photovoltaics (solar cells) and visible light photodetectors. Such optoelectronic devices typically incorporate a p/n heterojunction formed at the interface between p-type and n-type semiconducting layers. For organic materials the designation "n-type" indicates the material to exhibit electron accepting character, and as such is considered capable of transporting electrons. The measure of electron accepting character is usually provided either by the electron affinity or electrochemical reduction potential of the organic material. A "p-type" organic material, on the other hand, is considered to have electron donating character and as such is considered to be "hole transporting". The measure of electron donating character is usually provided by the ionization potential or electrochemical oxidation potential of the organic material. The simplest organic p/n heterojunction comprises a bilayer formed by the superposition of electron donor and electron acceptor semiconducting organic layers. Multiple organic donor/acceptor layers can be stacked to give a more complex design. Bulk heterojunctions have also been described, wherein the n-type and p-type organic semiconductor materials are blended to yield multiple donor/acceptor interfaces.

A principal feature of the p/n heterojunction is the built-in potential at the interface between the p-type (donor) material and the n-type (acceptor) material. To a first approximation this built-in potential is the origin of the rectifying nature, which arises from the differences in the ionization potentials and electron affinities of the two materials which make up the heterojunction. When electrons and holes are photogenerated in the vicinity of the junction, the field due to the built-in potential serves to separate the charge. The charge separation at the interface is, therefore, the origin of the photovoltaic effect. Such p/n heterojunction diodes can serve as photodiodes and as the fundamental element in a photovoltaic cell, commonly known as a solar cell.

A variety of photoactive organic molecules, crystals, pigments, conjugated and non-conjugated polymers, oligomers, and composites have been developed for use as semiconductor donor and acceptor materials for photovoltaic and photodetector applications. There are several guidelines in designing or selecting photoactive organic materials for such use. First, it is desired that the material have a high optical absorption coefficient $\alpha$ (alpha) for incident electromagnetic radiation. For photovoltaic (solar cell) and visible light photodetector applications, in particular, it is important for the organic material to exhibit a high optical absorption coefficient for visible and near infrared radiation so that very thin layers of the photosensitive organic material can be used to absorb nearly all of the incident radiation. Second, it is desired that the exciton (i.e., the excited state electron-hole bound pair) created by the process of light absorption by the photosensitive organic material have a long diffusion length L such that the exciton can migrate through the respective layer and reach the donor/acceptor (p-n) heterojunction before geminate recombination of quenching occurs. Third, it is desired that upon reaching the interface the exciton disassociates into electrons and holes due to the difference in ionization potential of the donor and the electron affinity of the acceptor. The latter process can be viewed as an exothermic chemical reaction, i.e., a reaction in which some energy is released as vibrational energy. This reaction occurs because the energy separation of the dissociated exciton, i.e., the energy difference between the free electron in the acceptor material and the free hole in the donor is smaller than the energy of the exciton prior to dissociation. Fourth, it is desired that the electron and holes created upon excition dissociation at the donor/acceptor interface have a high mobility in their respective layers so that they may be separately collected at opposing contacting electrodes and contribute to the photocurrent. Lastly, it is desired that the photosensitive organic material be easily processed to form the appropriately thin layers or blends of donor and acceptor component.

Unfortunately, prior art formulations of organic semiconducting materials have typically suffered from one or more disadvantages with regards to their optical or electronic materials properties and/or to their convenience for processing that have significantly restricted their use.

For example, a wide variety of "small" molecule materials and pigments have been used to fabricate p/n heterojunctions for photovoltaic and photodetector applications. References to the use of small molecule and pigment materials include C. W. Tang Appl. Phys. Lett. (1986) 48, 183, Peumans, P.; Yakimov, A.; Forrest, S. J. App. Phys. (2003), 93(7), 3693, Petritsch, K.; Dittmer, J. J.; Marseglia, E. A.; Friend, R. H.; Lux, A.; Rozenberg, G. G.; Moratti, S. C.; Holmes, A. B. Solar Energy Materials and Solar Cells (2000), 61(1), 63-72, all incorporated herein by reference. Typical of such materials are "electron-donor" copper phthalocyanine (CuPc) and "electron-acceptor" 3,4,5,10-perylenetetracarboxylic-bis-benzimidazole (PTCBI). Thin films of these materials can be fabricated with thermal evaporation, chemical vapor deposition (CVD) and so on. Simple donor/acceptor bilayers, as well as multiple alternating layers of donor and acceptor, can be assembled. However, vacuum sublimation is a batch process, which makes production scale runs quite costly, and thin, sublimed films are fragile and susceptible to damage. Alternatively, soluble derivatives of these materials can be prepared and dissolved in an appropriate solvent such that thin films can be fabricated by casting directly from solution or using similar fluid phase processing. Unfortunately, the films of molecular organic donor or acceptor materials prepared by vacuum or solution processing methods tend to be amorphous (non-crystalline) and, as such, generally exhibit small exciton diffusion lengths and low carrier mobility. Consequently, photovoltaic devices and photodetectors constructed from these amorphous materials exhibit relatively low photon-electric conversion efficiency (low quantum yield), being on the order of 2% or less.

Also, a variety of polymeric materials have been used to fabricate p/n heterojunctions for photovoltaic, photodetector, and other optoelectronic applications. Photosensitive junctions can be produced using two semiconducting organic layers in a donor/acceptor heterojunction (i.e., bilayer) structure or alternation layer structures. Conducting polymers which combine the electronic and optical properties of semiconductors and metals with the attractive mechanical properties and processing advantages of polymers have been described by A. J. Heeger, S. Kivelson, J. R. Schrieffer, W. P. Su, Review of Modern Physics 60, 781 (1988), incorporated herein by reference. The ability to control the energy gap and electronegativity through molecular design has enabled the synthesis of conducting polymers with a range of ionization potentials and electron affinities; See T. A. Skotheim, Ed., Handbook of Conducting Polymers Vol.-T, X-T (Marcel Dekker, New York 1986), J. L. Bredas and R. R. Chance, Eds., Conjugated Polymeric Materials: Opportunities in Electronics, Optoelectronics and Molecular Electronics (Kluwer Academic Press, Netherlands 1990), both incorporated herein by reference. The active layer can comprise one or more semiconducting, conjugated polymers, alone or in combination with non-conjugated materials, one or more organic molecules, or oligomers. The active layer can be a blend of two or more conjugated polymers with similar or different electron affinities and different electronic energy gaps. The active layer can be a blend of two or more organic molecules with similar or different electron affinities and different electronic energy gaps. The active layer can be a blend of conjugated polymers and organic molecules with similar or different electron affinities and different energy gaps. The latter offers specific advantages in that the different electron affinities of the components can lead to photoinduced charge transfer and charge separation; a phenomenon which enhances the photosensitivity [N. S. Sariciftci and A. J. Heeger, U.S. Pat. No. 5,333,183 (Jul. 19, 1994); N. S. Sariciftci and A. J. Heeger, U.S. Pat. No. 5,454,880 (Oct. 3, 1995); N. S. Sariciftci, L. Smilowitz, A. J. Heeger and F. Wudl, Science 258, 1474 (1992); L. Smilowitz, N. S. Sariciftci, R. Wu, C. Gettinger, A. J. Heeger and F. Wudl, Phys. Rev. B 47, 13835 (1993); N. S. Sariciftci and A. J. Heeger, Intern. J. Mod. Phys. B 8,237 (1994), all incorporated herein by reference]. The active layer can also be a series of heterojunctions utilizing layers of organic materials or blends as indicated above.

Typical p-type (donor) semiconducting polymers are poly-3-hexylthiophene (PT) and poly(2-methoxy, 5-(2'-ethyl-hexyloxy) paraphenylenevinylene (MEH-PPV). Other examples of typical semiconducting conjugated polymers include, polyacetylene, ("PA"), and its derivatives; poly-isothianaphlene and its derivatives; polythiophene, ("PT"), and its derivatives; polypyrrole, ("PPr"), and its derivatives; poly(2,5-thienylenevinylene), ("PTV"), and its derivatives; poly(pphenylene), ("PPP"), and its derivatives; polyflourene, ("PF"), and its derivatives; poly(phenylene vinylene), ("PPV"), and its derivatives; polycarbazole and its derivatives; poly(1,6-heptadiyne); polyisothianaphene and its derivatives; polyquinolene and semiconducting polyanilines (i.e. leucoemeraldine and/or the emeraldine base form). Representative polyaniline materials are described in U.S. Pat. No. 5,196,144, incorporated herein by reference. Bilayer p/n junction or blended (bulk) p/n heterjunction structures have been produced by layering or blending the donor semiconducting polymer with an acceptor material of n-type (acceptor) poly(cyanophenylenevinylene) ("CN—PPV"). Alternatively, fullerene molecules such as C 60 and its functional derivatives (such as PCBM), or organic molecules have been used an acceptor material of n-type (acceptor). The use of conjugated polymers as photosensitive materials has been described for example in the following reports: S. Karg, W. Riess, V. Dyakonov, M. Schwoerer, Synth. Metals 54, 427 (1993); H. Antoniadis, B. R. Hsieh, M. A. Abkowitz, S. A. Jenekhe, M. Stolka, Synth. Metals 64, 265 (1994); G. Yu, C. Zhang, A. J. Heeger, Appl. Phys. Lett. 64, 1540 (1994); Friend, R. H. Pure Appi. Chem. (2001) 73, 425-430; R. N. Marks, J. J. M. Halls, D. D. D. C. Bradley, R. H. Friend, A. B. Holmes, J. Phys.: Condens. Matter 6, 1379 (1994); A. J. Heeger and G. Yu, U.S. Pat. No. 5,504, 323 (April, 1996); R. H. Friend, A. B. Homes, D. D. C. Bradley, R. N. Marks, U.S. Pat. No. 5,523,555 (June, 1996). [G. Yu, H. Pakbaz and A. J. Heeger, Appl. Phys. Lett. 64, 3422 (1994); G. Yu, J. Gao, J. C. Hummelen, F. Wudl and A. J. Heeger, Science 270, 1789 (1995); G. Yu and A. J. Heeger, J. Appl. Phys. 78, 4510 (1995)], all incorporated herein by reference. Unfortunately, optoelectronic devices such as solar cells and photodetectors constructed using semiconducting polymers materials exhibit relatively low photon-electric conversion efficiency (low quantum yield).

On the other hand, it is known that the electronic and optical properties of organic semiconductors improve with increasing structural order. For example the exciton diffusion length L in single crystal naphthalene and anthracene is reported to be about 200 nm compared to less than 100 nm for many noncrystalline organic molecular films. Powell, R.; Soos, J.; J. Lumin. (1975) 11, 1-45, Meth, J.; Marshall, C.; Fayer, M.; Solid State Commun., (1990) 74, 281-284., Peumans, P.; Yakimov, A.; Forrest. S. J. App. Phys. (2003), 93(7), 3693, all incorporated herein by reference. The performance of amorphous organic semiconductor films is known to be enhanced by solvent and thermal annealing processes which tend to crystallize organic semiconductor materials. An enhancement in quantum efficiency has been demonstrated for example by solvent annealing to produce a crystal network in an organic solar cell containing a film of n-type (acceptor) perylene bis(phenethylimide) (Dittmer, J. J.; Lazzaroni, R.; Leclere, Ph.; Moretti, P.; Granstrom, M.; Petritsch, K.; Marseglia, E. A.; Friend, R. H.; Bredas, J. L.; Rost, H.; Holmes, A. B.; Solar Energy Materials and Solar Cells (2000), 61(1), 53-61, incorporated herein by reference.) Solvent treatment also improved the crystallinity and photovoltaic properties of a p-type magnesium phthalocyanine film (Hor, A. M.; Loufty, R. O. Thin Solid Films 1983, 106, 291-301). The exciton diffusion length L in films of n-type (acceptor) perylene bis(phenethylimide) have also been shown to increase upon crystallization by solvent annealing. (Gregg, B. J. Phys. Chem. (1996) 100, 852-859, incorporated herein by reference.) Carrier mobility in crystal networks is also much higher than in amorphous compositions. For vapor deposited layers Kotani has shown that carrier mobilities are strongly dependent on the substrate temperature during the vapor-deposition process, wherein high substrate temperature afforded increase film crystallinity and higher carrier mobilities increased nearly ten-fold (Kotani, T. et. al., In "Proceedings of the Eleventh International Congress on Advances in Non-Impact Printing Technologies", M. Hopper, ed., IS&T, Springfield, Va., ;42, 1995). Unfortunately, control over the morphology and extent of crystallization by such annealing processes is poor. Additionally, such solvent annealing processes can lead to formation of unwanted pinholes in the crystallized layer.

Organic semiconductor crystals have been successfully formulated for use as photoconductors for electrophotography as described in "Photoreceptors: Organic Photoconductors", P. Borsenberger, D. Weiss, in Handbook of Imaging Materials, $2^{nd}$ edition, Diamond and D. Weis, Ed, Marcel Dekker, New York 2002, pp 368-424. Compositions comprising finely-divided, crystalline n-type (acceptor) semiconductor pigment material perylene bis(phenethylimide) dispersed in an inert polymeric binder have been described, for example, by Gruenbaum et al. U.S. Pat. No. 4,968,571, and U.S. Pat. No. 5,019,473 incorporated herein by reference. Also, photoconductor compositions comprising crystalline and co-crystalline mixtures of titanylphthalocyanine semiconductor pigment materials dispersed in an inert (non-conducting) polymeric binder have been described by Molaire and Keading U.S. Pat. Nos. 5,614,342 and 5,766, 810, both incorporated herein by reference. While these aforementioned dispersions of semiconductor pigment in polymer binder are suitable for electrophotographic applications, these compositions are not sufficiently sensitive for photovoltaic and low-bias photodetector applications because the film-forming polymeric binder is electrically insulative.

For example, the inert polymeric binders used to prepare the electrophotographic photoconductor dispersions noted above include, for example, styrene-butadiene copolymers; vinyl toluene-styrene copolymers; styrene-alkyd resins; silicone-alkyd resins; soya-alkyd resins; vinylidene chloride-vinyl chloride copolymers; poly(vinylidene chloride); vinylidene chloride-acrylonitrile copolymers; vinyl acetate-vinyl chloride copolymers; poly(vinyl acetals), such as poly(vinyl butyral); nitrated polystyrene; poly(methylstyrene); isobutylene polymers; polyesters, such as poly[ethylene-coalkylenebis(alkyleneoxyaryl)phenylenedicarboxylate]; phenolformaldehyde resins; ketone resins; polyamides; polycarbonates; polythiocarbonates; poly[ethylene-coisopropylidene-2,2-bis(ethyleneoxyphenylene)-terephthalate]; copolymers of vinyl haloacrylates and vinyl acetate such as poly(vinyl-m-bromobenzoate-covinyl acetate); chlorinated poly(olefins), such as chlorinated poly (ethylene); cellulose derivatives such as cellulose acetate, cellulose acetate butyrate and ethyl cellulose; and polyimides, such as poly[1,1,3-trimethyl-3-(4'-phenyl)-5-indane pyromellitimide] and others. These polymers are not conjugated, do not contain an electrochemically active redox component, and as such are electronically insulating. Thus, as reported by Kitamujra and Yoshimura in: Proceedings of the Eighth International Congress on Advances in Non-Impact Printing Technologies, 1992, E. Hanson ed., IS&T, Springfield, Va., p237, for TiOPc dispersions in a polyester or polycarbonate, these pigment/polymer compositions exhibit low carrier mobility and require large applied electric fields in order to transport charge through the composition.

There is considerable published literature on photosensitive compositions that comprise n-type (electron-acceptor) organic semiconductor, such as C60 and its derivatives, dispersed in a p-type (electron donor) electronically conducting polymer, such as polythiophene or PPV and their derivatives. There is no prior art describing preparation or use of compositions that comprise n-type (electron-acceptor) organic semiconducto crystals dispersed in an n-type (electron donor) electronically conducting polymer. There are a few references; Hong, J.; Chen, H; Wang, M. J. Mater. Sci. 2003, 38, 4021, Nobutsugu, M.; Kanji, S. Kobunshi Ronbunshu 1983, 40, 211-216, Manabu, T.; Satoshi, O.; Hiroyki, T.; Seiko, N.; Hideo, N. Tech. Dig.-Int. Photovoltaic Sci. and Eng. Conf., $1^{st}$ (1984) pp263-266, Takashi, K.; Akira, K.; Shunji, I. Denshi Shashin Gakkaishi 1984, 23, 18-23, that relate to the preparation and use of dispersions of a phthalocyanines pigment in the binder polymer of polyvinylcarbazole (PVK). Although not specified or demonstrated in these latter references, and although phthalocyanine pigments can exhibit n-type or p-type behavior depending on method of preparation and treatment, it may be considered that the phthalocyanine pigment is p-type in the above cited references and the PVK polymer is an electron donating polymer, hence comprising a p-type pigment dispersed in an electron donating (p-type) polymer. PVK polymer has a relatively high ionization potential, 5.8 eV as reported by Anderson et al, J. Am. Chem. Soc. (1998), 120, 9646-9655 and Kido, J.; Shionoya, H.; Nagai, K. Appl. Phys. Lett. (1995), 67, 2281, whereas the typical ionization potential for a metal phthalocyanine is about 4.9 eV [4.8 eV for copper phthalocyanines as reported by Lee. S.; Wang, M.; Hou, X.; Tang, C. Appl. Phys. Lett (1999), 74, 670-672) and 5.03 eV for zinc phthalocyanine as reported by Kimura, T.; Sumimoto, M.; Sakaki, S.; Fujimoto, H.; Hashimoto, Y.; Matsuzaki, S. Chem. Phys. (2000), 253(1), 125-131]. Thus, in these cited examples, the ionization potential of the phthalocyanine differs substantially from that of PVK amount (the difference being greater than 0.5 eV). Hence, carrier (hole) mobility through the composition remains very poor because there is an energetic barrier (>0.5 eV) for the hole to move from the phthalocyanine to PVK.

PROBLEM TO BE SOLVED

There is a continuing need for photosensitive organic semiconductor compositions that may be used to produce various optoelectronic devices including photodiodes, photodetectors, and photovoltaic devices (solar cells). Present organic semiconductor compositions for optoelectronic device applications such as photodetectors and photovoltaic devices are deficient in one or more attributes of exciton diffusion length, carrier mobility, and optical absorption coefficient.

SUMMARY OF THE INVENTION

The present invention relates to a photosensitive organic semiconductor composition comprising at least one organic p-type (electron donor) semiconductor pigment with at least one p-type (electron donor) conducting polymer, wherein the ionization potential of said at least one organic p-type (electron donor) semiconductor pigment and the ionization potential of said at least one p-type (electron donor) conducting polymer are nominally equivalent. The present invention also relates to a photosensitive organic semiconductor composition comprising at least one organic n-type (electron donor) semiconductor pigment with at least one n-type (electron donor) conducting polymer, wherein the electron affinity of said at least one organic n-type (electron donor) semiconductor pigment and the electron affinity of said at least one n-type (electron donor) conducting polymer are nominally equivalent, as well as a p/n heterojunction comprising a combination of at least one layer comprising p-type organic semiconductor pigment with at least one p-type conducting polymer, wherein the ionization potential of said at least one p-type organic semiconductor pigment and the ionization potential of said at least one p-type conducting polymer are nominally equivalent and at least one layer comprising at least one n-type organic semiconductor pigment with at least one n-type conducting polymer, wherein the electron affinity of said at least one n-type organic semiconductor pigment and the electron affinity of said at least one n-type conducting polymer are nominally equivalent.

ADVANTAGEOUS EFFECT OF THE INVENTION

The present invention includes several advantages, not all of which are incorporated in a single embodiment. The specific combination of organic semiconductor pigment crystals with conducting polymers wherein the ionization potential (electron affinity) of the pigment and the ionization potential (electron affinity) of the polymer are nominally equivalent provides for semiconductor compositions with unique electrical, optical, electrochemical, and processing properties. The p-type (electron donor) photosensitive organic semiconductor pigment/polymer composition and n-type (electron acceptor) photosensitive organic semiconductor pigment/polymer compositions may be formed into bilayers and multilayers and into a blended or bulk p/n heterojunction. The compositions may be in optoelectronic devices including photodiodes, visible spectrum photodetectors, and photovoltaic devices (solar cells).

DETAILED DESCRIPTION OF THE INVENTION

Figure 1:
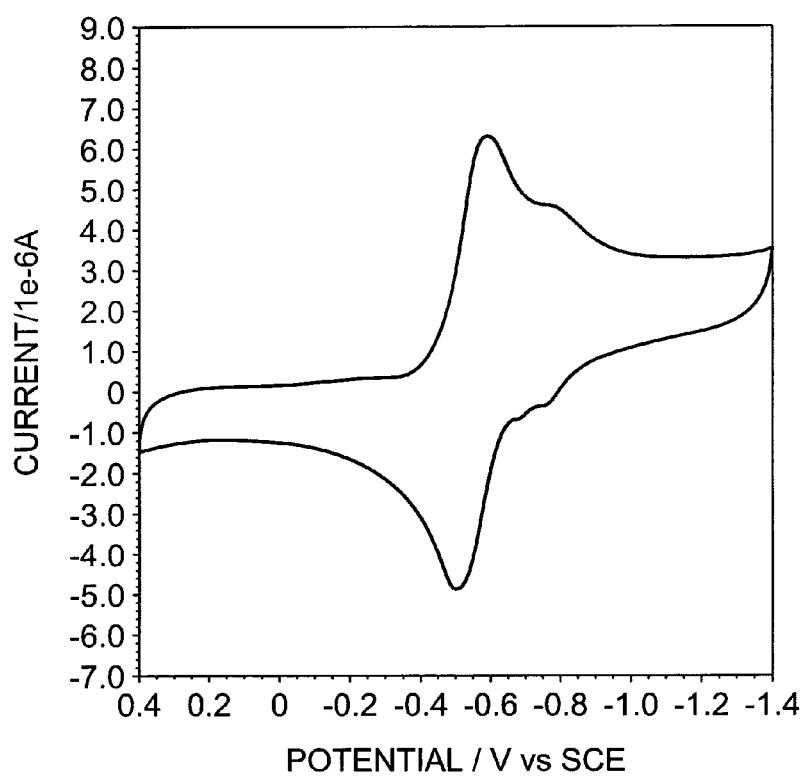
FIG. 1. Cyclic voltammogram of naphthimide conducting polymer NB-2 recorded at a glassy carbon electrode in 3:1 methylene chloride/methanol containing 0.1 M tetrabutylammoniumtetrafluoroborate.

This present invention relates to photosensitive organic semiconductor compositions that comprise a stable dispersion of nanometer-sized organic semiconductor pigment crystals in an electronically conducting polymeric binder. More specifically it relates to photosensitive organic semiconductor compositions wherein the ionization potential (electron affinity) of the pigment and the ionization potential (electron affinity) of the polymer are nominally equivalent. The term "nominally equivalent" as used herein refers to a difference in ionization potential of the pigment and its associated polymer of less than 0.5 eV, or a difference in the electron affinity of the pigment and the electron affinity of the polymer of less than 0.5 eV. Optimally these differences are less than 0.2 eV, and most optimum is the condition where these differences are less than 0.1 eV.

Thus described are p-type (electron donor) photosensitive organic semiconductor compositions that comprise nanometer-sized p-type (electron donor) organic semiconductor pigment crystals with an ionization potential IP that are dispersed in an p-type (electron donor) electronically conducting polymeric binder that has a similar ionization potential. Likewise, are described n-type (electron acceptor) photosensitive organic semiconductor compositions that comprise nanometer-sized n-type (electron acceptor) organic semiconductor pigment crystals with an electron affinity (also referred to herein as EA) that are dispersed in an n-type (electron acceptor) electronically conducting polymeric binder that has a similar electron affinity. The specific combination of organic semiconductor pigment crystals with conducting polymers wherein the ionization potential (electron affinity) of the pigment and the ionization potential (electron affinity) of the polymer are nominally equivalent provides for semiconductor compositions with unique electrical, optical, electrochemical, and processing properties.

It would be advantageous to prepare photosensitive organic semiconductor compositions that comprise a stable dispersion of nanometer-sized organic semiconductor pigment crystals in an electronically conducting polymeric binder wherein the polymer binder facilitates the motion of charge carriers throughout. In order to maximize carrier transport within the composition, it is preferred to prepare the composition wherein the ionization potential of the pigment (for p-type pigment) and the ionization potential of the polymer (p-type polymer) are nominally equivalent. Likewise, to maximize carrier transport within an n-type composition the composition would comprise an n-type (electron-acceptor) organic semiconductor dispersed in a n-type (electron acceptor) electronically conducting polymer wherein the electron affinity of the pigment and the electron affinity of the polymer are nominally equivalent. Such photosensitive organic semiconductor compositions may be used to produce various optoelectronic devices including photodiodes, photodetectors, and photovoltaic devices (solar cells).

The concept of preparing or use of a composition comprised of an n-type (electron-acceptor) organic semiconductor dispersed in a n-type (electron acceptor) electronically conducting polymer wherein the electron affinity of the pigment and the electron affinity of the polymer are nominally equivalent has not been disclosed in the prior art. Likewise, the concept of preparing use of a composition comprised of a p-type (electron-donor) organic semiconductor in a p-type (electron donor) electronically conducting polymer wherein the ionization potential of the pigment and the ionization potential of the polymer are nominally equivalent has not been disclosed in the prior art. The specific use of the organic semiconductor/conducting polymer compositions to prepare p/n heterojunctions for optoelectronic applications has also not been disclosed in the literature.

This invention also relates to p/n heterojunctions prepared by combination of the p-type (electron donor) photosensitive organic semiconductor pigment/polymer composition and the n-type (electron acceptor) photosensitive organic semiconductor pigment/polymer compositions into bilayers and multilayers. This invention also relates to p/n heterojunctions prepared by combination of the p-type (electron donor) photosensitive organic semiconductor pigment/polymer composition and the n-type (electron acceptor) photosensitive organic semiconductor pigment/polymer compositions into a blended or bulk p/n heterojunction. This invention also relates to the use of the p/n heterojunctions of photosensitive organic semiconductor pigment/polymer compositions in various optoelectronic devices including photodiodes, visible spectrum photodetectors, and photovoltaic devices, such as solar cells.

This invention also utilizes the processing advantages associated with the fabrication of p/n heterojunction diode structures from a dispersion of nanometer-sized organic semiconductor pigment in a soluble conducting or conjugated polymers (and/or their precursor polymers). The dispersion may be cast from solution to enable the fabrication of large active areas.

Photosensitive p-type (electron donor) organic semiconductor compositions that comprise nanometer-sized p-type (electron donor) organic semiconductor pigment crystals with an ionization potential IP that are dispersed in an p-type (electron donor) electronically conducting polymeric binder that has a similar ionization potential. In a preferred embodiment the ionization potentials of the electron-donor pigment and electron-donor conducting polymer differ by less than 0.5 eV. In a more preferred embodiment the ionization potentials of the pigment and conducting polymer differ by less than 0.2 eV. In a most preferred embodiment the ionization potentials of the pigment and conducting polymer differ by less than 0.1 eV.

Any p-type semiconducting organic pigment may be utilized. Most preferred are those that exhibit high absorption for visible and near infrared radiation. Representative examples of p-type semiconducting pigment include the substituted and unsubstituted metal-free phthalocyanines, substituted and unsubstituted metallophthalocyanines, and porphyrins, among others. The class of p-type pigment materials that is most useful in the aforementioned composition is the metallophthalocyanines.

Preferred p-type semiconducting pigment materials are those that can be prepared or processed to form nanometer-sized crystals for dispersion into the polymer. Preferred particle sizes are less than 0.5 micron in length. More preferred particle sizes are less than 0.2 micron in length. Preferred particle sizes are less than 0.1 micron in length.

Acceptable procedures for processing p-type semiconducting pigment materials to form nanometer-sized crystal dispersions include dry-milling, salt-milling, acid-pasting, and solvent milling, among others. The optimum ratio of pigment material to conducting polymeric binder may vary widely depending upon the particular materials employed. The pigment material can be a single pigment or it can be two or more pigments used in various ratios. In general, useful results are obtained when the amount of pigment material contained within the layer is within the range of from about 0.01 to 90 weight percent, based on the dry weight of the layer. A very high pigment to binder ratio is preferred. Various solvents may be added to the composition during and after the milling procedure to facilitate pigment crystallization and to provide dispersion stability and coatability as described in Molaire and Keading U.S. Pat. Nos. 5,614,342 and 5,766,810, both incorporated herein by reference.

The ionization potential may be measured by methods described in the art, e.g., photoelectron spectroscopy. Alternatively, electrochemical methods may be used to measure the oxidation potential of the material which can be related to the ionization potential by methods known in the art (see for example Loutfy, R. O.; Sharp, J. H. Photogr. Sci. Eng. (1976) 20, 165 and Reiss, H.; Heller, A. J. Phys. Chem. (1985), 89, 4207).

Any p-type conducting polymer may be used. Preferred polymers are those that exhibit weak or no absorption of visible or near infrared light. Useful polymers in this class includes various pi-conjugated polymers such as the polythiophenes, poly(3-alkyl)thiophenes, polyisothianaphthene, polyethylenedioxythiohenes, poly-p-phenylenevinylenes, poly-(2,5 dialkoxy)-p-phenylenevinylenes, poly-p-phenylenes, polyheptadiynes, polyanilines, polypyrroles, polyfluorenes, poly(2-vinylpyridines), and the like as described for example in Heeger, A. J., J. Phys Chem B (2001) 105, 8475-8491 and "Polymers for Photonics Applications I", K. S. Lee ed, $1^{st}$ edition, Springer Verlag (2002). Also included are non-conjugated conducting polymers, that is so called "redox polymers", that comprise electrochemically active components incorporated as main chain moieties or as pendant moieties that are covalently linked to an insulating backbone. Examples of this class of pendant arylamine and main chain arylamine conducting polymers are structures I and II shown below as described for example in Linberg et al. U.S. Pat. No. 5,155,200 and U.S. Pat. No. 5,030,532 and Facci et. al., Mol. Cryst. Liq. Cryst. (1991) 194, pp 55-63.

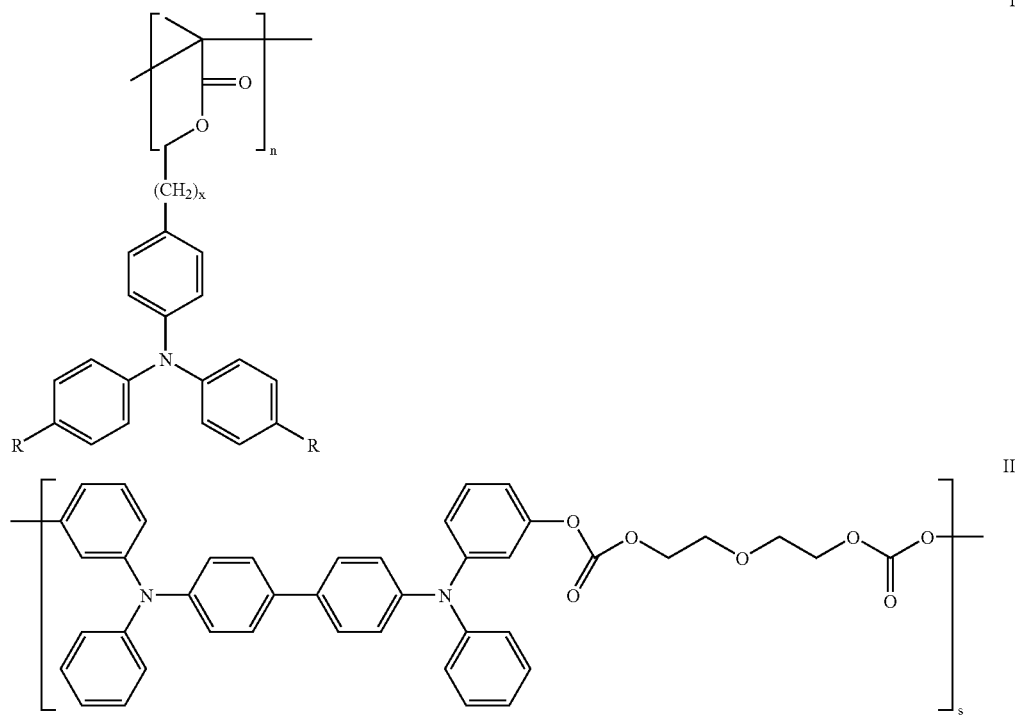

wherein n, x, and s are intergers, and R is a substituted or unsubstituted alkyl, aryl, alkyloxy group or a halogen atom, or hydrogen atom.

Preferred polymers are those that exhibit only weak absorption of visible or near infrared electromagnetic radiation. Most preferred are polymers that exhibit no absorption of visible or near infrared electromagnetic radiation, i.e., are transparent.

The ionization potential may be measured by methods described in the art, e.g., photoelectron spectroscopy. Alternatively, electrochemical methods may be used to measure the oxidation potential of the material as demonstrated by Li et al, Synthetic Metals (1999) 99, 243-248, incorporated herein by reference. Oxidation potentials measured by electrochemical methods can be related to the ionization potential by methods known in the art (see for example Loutfy, R. O.; Sharp, J. H. Photogr. Si. Eng. (1976) 20, 165 and Reiss, H.; Heller, A. J. Phys. Chem. (1985), 89, 4207).

Photosensitive n-type (electron acceptor) organic semiconductor compositions that comprise nanometer-sized n-type (electron acceptor) organic semiconductor pigment crystals with an electron affinity EA that are dispersed in an n-type (electron acceptor) electronically conducting polymeric binder that has a similar electron affinity. In a preferred embodiment the electron affinities of the electron-acceptor pigment and electron-acceptor conducting polymer differ by less than 0.5 eV. In a more preferred embodiment the electron affinities of the pigment and conducting polymer differ by less than 0.2 eV. In a most preferred embodiment the electron affinities of the pigment and conducting polymer differ by less than 0.1 eV.

Any n-type (electron acceptor) semiconducting pigment may be utilized. Most preferred are those that exhibit high absorption for visible and near infrared radiation. Representative examples of n-type semiconducting pigment include the aromatic imides derived from 3,4,9,10-perylenetetracarboxylic dianhydride (PTDA), among others. The class of n-type (electron acceptor) pigment materials that is most useful in the aforementioned composition are the perylene-diimides.

Preferred n-type semiconducting pigment materials are those that can be prepared or processed to form nanometer-sized crystals for dispersion into the polymer. Preferred particle sizes are less than 0.5 micron in length. More preferred particle sizes are less than 0.2 micron in length. Preferred particle sizes are less than 0.1 micron in length.

Acceptable procedures for processing n-type semiconducting pigment materials to form nanometer-sized crystal dispersions include dry-milling, salt-milling, acid-pasting, and solvent milling, among others. The optimum ratio of pigment material to conducting polymeric binder may vary widely depending upon the particular materials employed. The pigment material can be a single pigment or it can be two or more pigments used in various ratios. In general, useful results are obtained when the amount of pigment material contained within the layer is within the range of from about 0.01 to 90 weight percent, based on the dry weight of the layer. A very high pigment to binder ratio is preferred. Various solvents may be added to the composition during and after the milling procedure to facilitate pigment crystallization and to provide dispersion stability and coatability.

The electron affinity may be measured by methods described in the art, e.g., photoelectron spectroscopy. Alternatively, electrochemical methods may be used to measure the reduction potential of the material by electrochemical methods as demonstrated by Li et al, Synthetic Metals (1999) 99, 243-248, incorporated herein by reference. Reduction potentials measured by electrochemical methods can be related to the electron affinity by methods known in the art. (see for example Loutfy, R. O.; Sharp, J. H. Photogr. Si. Eng. (1976) 20, 165).

Any n-type conducting polymer may be used. This includes electron accepting conjugated polymers such as halogen substituted polyphenylenevinylenes like poly(cyanophenylenevinylene) III and the like as described in Tillmann, H.; Horhold, H.-H. Synthetic Metals (1999), 101 (1-3), 138-139, Vaschetto, M. E.; Springborg, M. Synthetic Metals (1999), 101(1-3), 502, Greenham, N. C.; Cacialli, F.; Bradley, D. D. C.; Friend, R. H.; Moratti, S. C.; Holmes, A. B. Materials Research Society Symposium Proceedings (1994), 328(Electrical, Optical, and Magnetic Properties of Organic Solid State Materials), 351-60.

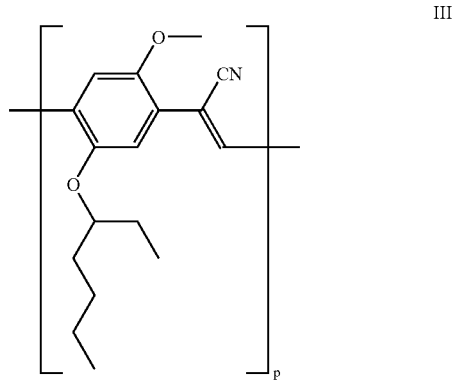

III where p is an interger

Also included are non-conjugated conducting polymers, that is "redox polymers" that comprise electrochemically active components incorporated as main chain moieties or as pendant moieties that are covalently linked to an insulating backbone. Examples of this class of conducting polymers are described by Sorriero et al US 2003/0162109 and U.S. Pat. No. 6,593,046, and by Mackinnon, S.; Wang, Z.; J. Poly. Sci. (2000), 38, 3467-3475, and Wiederrecht, G.; Wasielewski, M. R. J. Am. Chem. Soc. (1998), 120 3231-3236, all incorporated herein by reference. An example of such polymers are acrylate polymers represented by general formula 1:

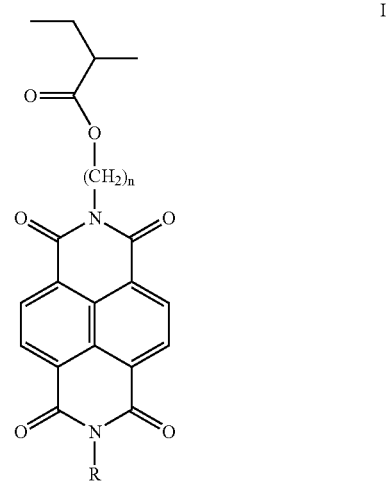

I wherein m and n are integers and R is a substituted or unsubstituted alkyl or aryl group. Another example is condensation polymers having covalently bonded as repeating units in the polymer chain, aromatic tetracarbonylbisimide groups of the formula II and III

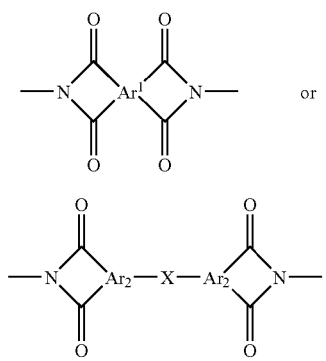

wherein $Ar^1$ and $Ar_2$ repectively represent tetravalent or trivalent aromatic groups of 6 to about 20 carbon atoms, and X is O, $C(CF_3)_2$, S=O or $SO_2$. Polymers II and III may be, for example, a polyester-co-imide as described in Sorriero et al U.S. Pat. And Application No. 2003/0162109 and U.S. Pat. No. 6,593,046, incorporated herein by reference.

Preferred polymers are those that exhibit only weak absorption of visible or near infrared electromagnetic radiation. Most preferred are polymers that exhibit no absorption of visible or near infrared electromagnetic radiation, i.e., are transparent.

Thin layers of the aforementioned organic semiconductor compositions that comprise nanometer-sized n-type or p-type organic semiconductor pigment crystals/conducting polymer may be formed by any method known in the art, including roll coating and dip-coating, as described for example in Organic Photoreceptors for Xerography, P. Borsengerger, D. Weiss, Marcel Dekker, New York (1998) pp 112-117, spin-coating, inkjet, and the like.

The p/n heterojunction is prepared by coating onto a rigid or flexible support in succession a combination of the p-type (electron donor) photosensitive organic semiconductor pigment/polymer composition and the n-type (electron acceptor) photosensitive organic semiconductor pigment/polymer compositions into bilayers or multilayers. In order to achieve a bilayer or multplayer format it may be advantageous to utilize polymers and/or coating solvents such that extensive mixing of the p-type and n-type layers does not occur during the coating process. Alternatively, it may be advantageous to utilize curable polymers in the preparation of the p-type and/or n-type pigment polymer composition, such that following the deposition of the first layer, said layer may be cross-linked via application of heat or light so that during the process of coating the second layer intermixing of the layers is prevented. Alternatively the p/n heterojunction is prepared by first coating onto one rigid or flexible support the p-type photosensitive organic semiconductor pigment/polymer composition and coating the n-type photosensitive organic semiconductor pigment/polymer composition onto a second support, or vice versa, and subsequently laminating the two coated supports together with heat or solvent vapor annealing.

A photovoltaic cell is prepared that has an active structure comprising a bilayer of the p-type (electron donor) photosensitive organic semiconductor pigment/polymer composition and the n-type (electron acceptor) photosensitive organic semiconductor pigment/polymer compositions wherein the two layers re in electrical contact with one another. The active structure also includes an electrically conductive contact structure to the p-type layer and a second electrically conductive contact to the n-type layer. At least one of the electrically conductive contacts permits visible and near IR light to pass therethrough to the n- and p-type layers. Additional layers may be placed between the n-type layer and its electrically conducting contact and/or between the p-type layer and its electrically conducting contact to provide ohmic contact.

The following examples are provided to illustrate the invention.

EXAMPLE 1

An n-type (electron acceptor) semiconductor composition of a stable dispersion of nanoparticle semiconductor pigment in a solvent solution of an electronically conducting polymer was prepared using the semiconductor pigment material 3,4,9,10-perylenetetracarboxylic dianhydride compound denoted as UD-1 (structure below). The pigment is a perylene diimide useful in the preparation of photodiodes for photovoltaics and other optoelectronic applications. The pigment was milled to a small particle size and dispersed in the n-type electronically conducting polymer derived from 1,4,5,8-naphthalenetetracarboxylic dianhydride. The electrochemical reduction potential of the naphthimide containing polymer NB-2 is similar, that is within 0.2 V, of the reduction potential of a perylene diimide material.

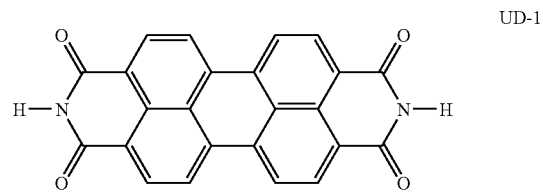

The conducting polymer NB-2 is comprised of the following component parts: 12.5% DDA, 15% NX62, 2.5% AB, 5% EO2EA, 5% NB3, 30% NX3, and 30% NB10.

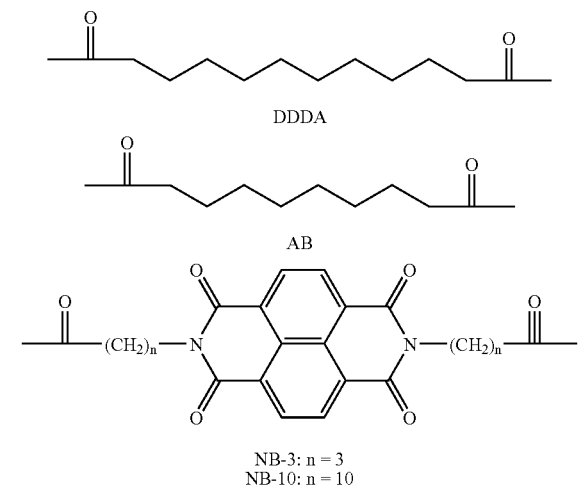

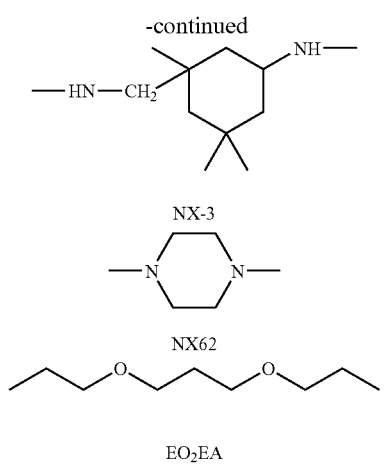

NX-3

NX62

EO₂EA

The electronically conducting polymer used herein are described in US patent application publication US2003/0162109 A1 Aug. 28, 2003, incorporated herein by reference. This reference also shows the cyclic voltammetry (reproduced in FIG. 1) at a carbon electrode for the polymer dissolved in 3:1 dichloromethane:methanol containing 0.1 M tetrabutylammoniumtetrafluoroborate supporting electrolyte indicating a reversible reduction process at ca.−0.55V vs SCE.

The reduction potential for the perylene diimide pigment has not been directly measured due to its insolubility. However, reduction potentials for other closely related perylenediimides have been reported. The reduction potentials for perylenediimides are typically −0.5 V to −0.6 V vs SCE (J. Amer. Chem. Soc., (1999) vol 121 (14) pp 3515, incorporated herein by reference. Thus the reduction potentials for the pigment particle and the conducting polymer binder are within 0.1 V of each other, that is they are nominally equivalent. The pigment UD-1 was prepared by published standard procedures for synthesizing perylenediimide materials and purified by vacuum sublimation at 460° C. A ball mill (800 ml glass) was charged with 304 g of ⅛ inch chrome steel beads and 2.0 g of UD-1. The mixture was sheared by milling at about 68 rpm for 14 days at a temperature of 21 C. The resulting pigment was extracted from the beads with water and then dried in an oven at 60 C. The milled pigment from the first stage was transferred to an attritor milling vessel containing a plastic 50 ml conical tube and a stainless steel stirrer. The stirrer consisted of a rotating shaft with 18 small side arms aligned in 4 rows along the lower part of the shaft at 90 degrees to each other and extending perpendicular from the shaft toward the side wall of the vessel. Added to the tube was 46 g of 1/16 inch stainless steel beads and 10 mls of a mixture of UD-1 (5% by wgt), NB-2 (6% by wgt) and solvent (98% by wgt) of 3:1 of 1,1,2-trichloroethane/2-propanol. The mixture was agitated at 2200 rpm for 8 hours with periodic solvent addition to compensate for minor evaporation.

Figure 2:
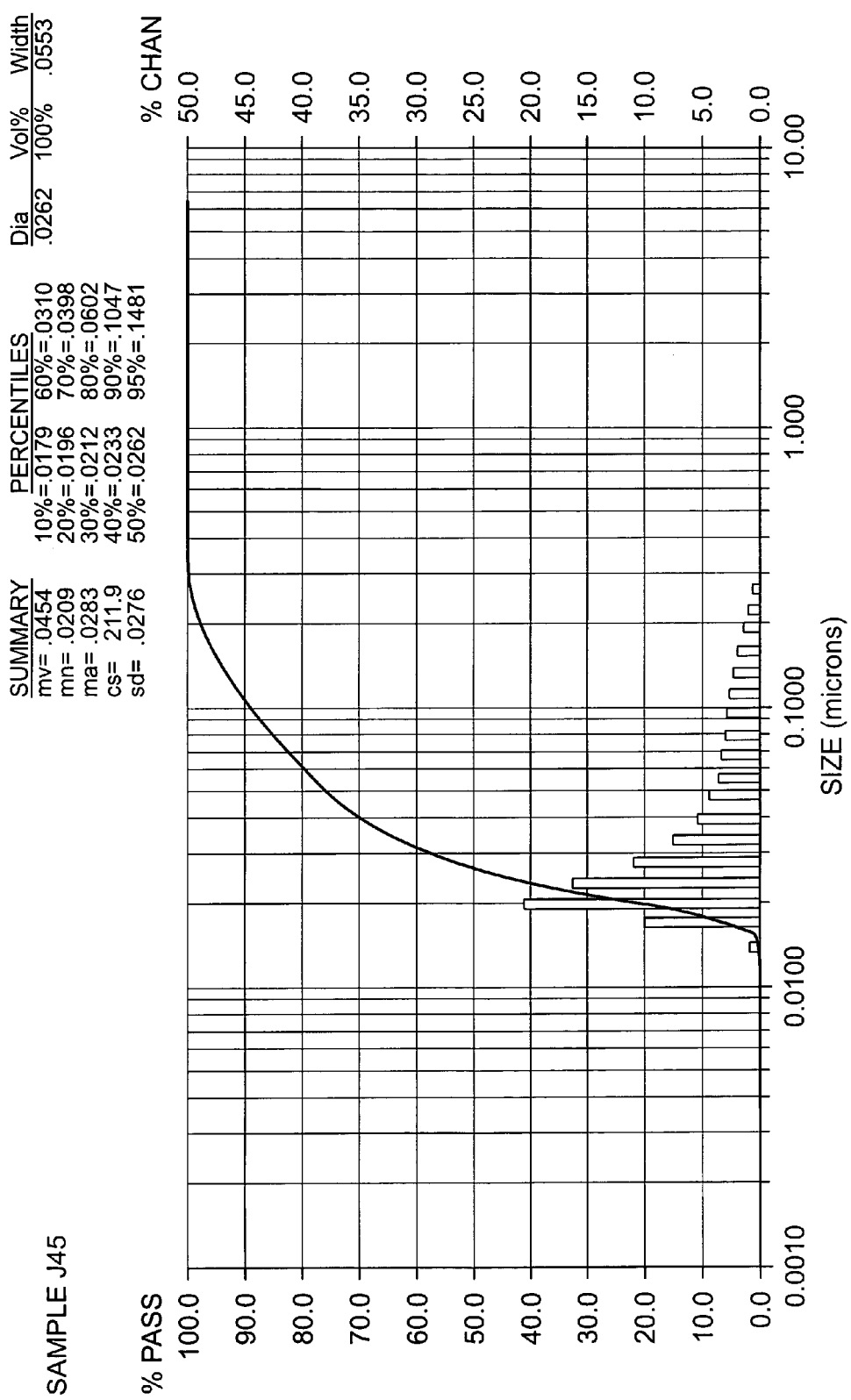
FIG. 2. Sizing data for dispersion of UD-1 pigment material in naphthimide conducting polymer NB-2 with a Model UPA-15 (Microtrac) ultrafine particle analyzer.

8 ml of the dispersion were removed from the milling vessel (leaving about 2 ml of dispersion) and 9 ml of 3:1 of 1,1,2-trichloroethane/2-propanol mixture was added along with 63 g of additional beads and this mixture was further milled at 2200 rpm for 16 hrs. A sample of this final 6% dispersion was further diluted in NB-2/mixed solvent solution and subjected to particle size analysis using a Microtrac Model UPA-150 ultrafine particle analyzer. The particle sizing data in FIG. 2 show a primary population median at 0.026 um with the remainder of the distribution fairly evenly split between size populations of 0.05 to 0.1 um and 0.1 to 0.2 um.

Figure 3:
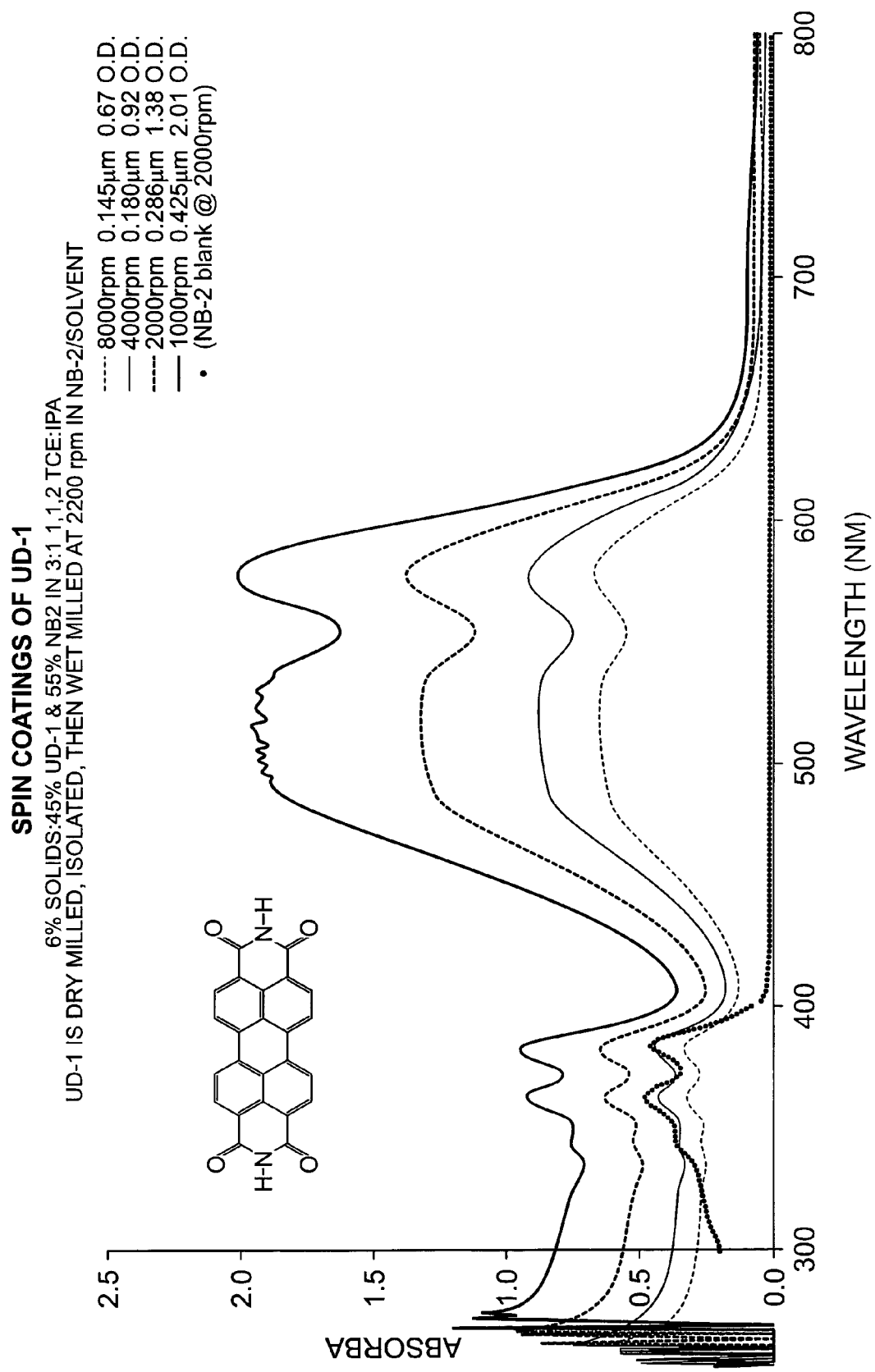
FIG. 3. UV-vis absorption spectra for spin coated films of UD-1 pigment material dispersed in naphthimide conducting polymer NB-2. Table 3 lists rotation speed (rpm), film thickness (μm), and film optical density (OD) at 578 nm.

Thin films of the final dispersion were prepared by spin coating using a Headway PWM 32 model spin coater onto pre-cleaned 50 mm×50 mm glass slides. Various rotation speeds were utilized to provide samples of various film thicknesses. UV-vis absorption spectra are measured for the coated slides using a HP8450A diode array spectrophotometer and are illustrated in FIG. 3. The absorbance in the spectral region of 400 nm to 650 nm is due to the light absorption by the UD-1 pigment material. Spectral absorption due to the naphthimide conducting polymer NB-2 is confined to wavelengths under about 400 nm. Film thickness was measured on a Tencor P-10 Surface Profilometer.

The following data Table 3 lists the rotation speed (rpm) for preparation of the spin coating, the thickness of the deposited layer (in micron μm), and the Absorbance (optical density OD) measured at 578 nm. The data show that the coated dispersion exhibits a high degree of light absorption in the visible spectral region at minimal film thickness.

TABLE 3

| Sample | Spin coating rotation speed (rpm) | thickness (in micron μm) | Absorbance (optical density OD) |
|---|---|---|---|
| Blue | 8000 | 0.145 | 0.67 |
| Purple | 4000 | 0.180 | 0.92 |
| Green | 2000 | 0.286 | 1.38 |
| Red | 1000 | 0.425 | 2.01 |
| blank | 2000 | | |

The results demonstrate the preparation of a photosensitive n-type (electron acceptor) organic semiconductor composition that comprises nanometer-sized n-type (electron acceptor) organic semiconductor pigment crystals dispersed in an n-type (electron acceptor) electronically conducting polymeric binder wherein the electron affinities of the pigment and polymer as measured by their respective electrochemical reduction potentials are within 0.2 V. The results also show that thin films of varying thickness of the n-type (electron acceptor) organic semiconductor dispersion can be conveniently cast onto a solid substrate. The results also show that the thin films exhibit strong absorption of visible electromagnetic radiation and hence are suitable for use as photosensitive n-type (electron acceptor) organic semiconductor compositions for preparing p/n heterojunctions for use in optoelectronic devices such as photodiodes, photodetectors, and photovoltaic (solar cells) cells.

EXAMPLE 2

A ball mill (1 gal glass) was charged with 9000 g of ⅛ inch chrome steel beads and 75.0 g of titanium, oxo(29H, 31H-phthalocyaninato(2-)-.kappa.N29,.kappa.N30,.kappa.N31,.kappa.N32)-, (SP-5-12)-[C32H16N8 O Ti] "TiOPc" containing 1.3 wt % chlorine impurity. The mixture was sheared by milling at about 110 rpm for 7 days at room temperature (about 23° C.). A sample of the resulting pigment was extracted from the beads with water and then dried over night under vacuum at room temperature. 5970 g of the milled pigment with beads was transferred to a 250 ml glass jar, 1305 g of dichloromethane (DCM) was added and the mixture was milled another 24 hours at 117 rpm at room temperature. After this second milling, the pigment/DCM slurry was decanted into a clean 1 gal glass jar. The beads were rinsed 3 times with fresh DCM, and the resulting pigment/DCM was also added to the 1 gal glass jar. The pigment was filtered through a 350 ml medium glass frit under water stream vacuum. The resulting sludge was transferred to petri dishes and dried under vacuum over night at room temperature. The dried pigment was analyzed by XRD and found to be highly crystalline of TiOPc Type V.

To prepare the pigment binder slurry for coating, an attritor milling vessel containing a plastic 50 ml conical tube and a stainless steel stirrer were used. The stirrer consisted of a rotating shaft with 18 small side arms aligned in 4 rows along the lower part of the shaft at 90 degrees to each other and extending perpendicular from the shaft toward the side wall of the vessel. Added to the tube were 40 g of 0.2 mm YSZ beads (Yttria Stabilized Zirconium Oxide), 0.88 g of the milled TiOPc, and 0.22 g of the tri-tolylamine polymer T1 [Mw=80,800] dissolved in 12 ml toluene. The polymer was dissolved in the toluene over night under stirring at room temperature and filtered through a 1 micron filter. The mixture was agitated at 2200 rpm for 6 hours.

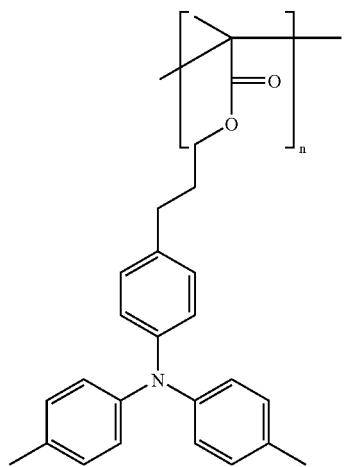

T1

After the 6 hours of wet milling, the plastic tube containing the slurry was removed from the attritor, slurry adhering to the upper walls of the tube was carefully removed, the amount of remaining slurry in the tube determined by weight and enough fresh toluene added to the slurry to result in a 5% total solids concentration of pigment and binder in toluene. After mixing the toluene and slurry by vigorous shaking, the YSZ beads were allowed to settle for 10 minutes and the supernate was carefully removed by pipette. The pigment dispersion (supernate) was sonicated for 1 hour in ice water prior to coating.

Figure 4:
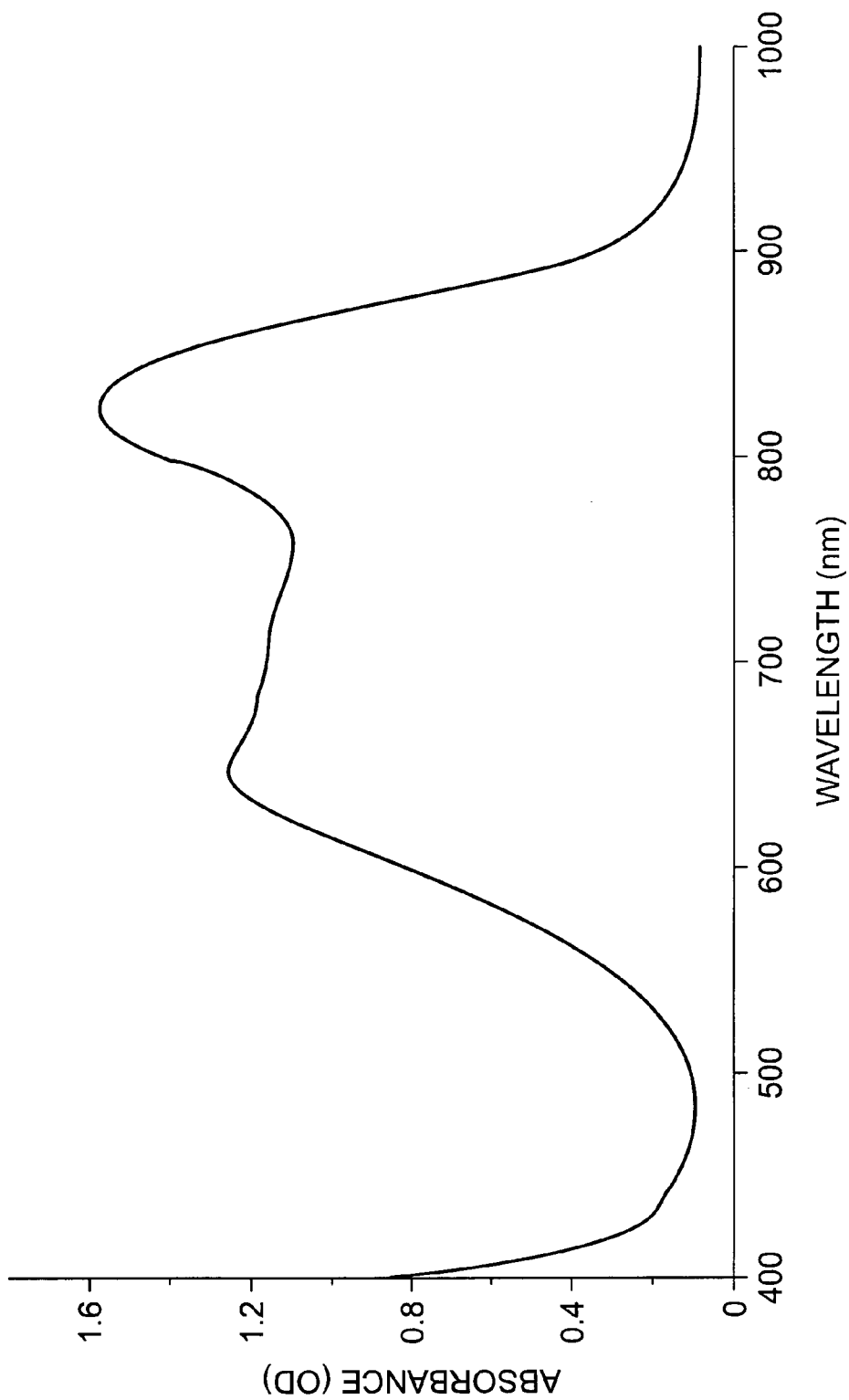
FIG. 4. UV-vis NIR absorption spectra for a 0.347 micron thick spin-coated film of TiOpc pigment material dispersed in tritolylamine conducting polymer T-1

Thin films of the final dispersion were prepared by spin coating using a Headway PWM 32 model spin coater onto pre-cleaned 50 mm×50 mm glass slides. Various rotation speeds were utilized to provide samples of film thicknesses of 0.076, 0.114, and 0.347 micron. UV-vis absorption spectra measured for the 0.347 micron thick coated slide using a Cary 5E UV-vis-NIR spectrophotometer and are illustrated in FIG. 4. The absorbance in the spectral region of 500 nm to 900 nm is due to the light absorption by the TiOPc pigment material. Spectral absorption due to the tri-tolylamine polymer is confined to wavelengths under about 400 nm. The peak absorbance for TiOpc (827 nm+/−2 nm) is 0.45, 0.57, and 1.58 for film thickness of 0.076, 0.114, and 0.347 micron, respectively. Film thickness was measured on a Tencor P-10 Surface Profilometer.

Particle size of the TiOPc pigments was estimated based on Transmission Electron Microscopy (TEM) micrographs according to a procedure known to those versed in the art. TEM micrographs were obtained by spin coating the aforementioned dispersion onto glass slides, which were pre-coated with a formvar polymer coating. By dipping of these double-coated slides into water, the formvar/dispersion coating could be stripped off the slide and taken up from the water surface onto a copper TEM grid, without wetting of the dispersion coating. Analysis of such TEM micrographs suggests a primary pigment particle size between 30 and 70 nm, with occasional particles of 120 nm or larger. Literature data indicate the ionization potential of the metal phthalocyanine to be within 0.2 eV of that of the active redox component (p-tritolylamine) of the polymer.

The data show that the coated dispersion exhibits a high degree of light absorption in the visible spectral region at minimal film thickness. The results demonstrate the preparation of a photosensitive p-type (electron donating) organic semiconductor composition that comprises nanometer-sized p-type (electron donor) organic semiconductor pigment crystals dispersed in an p-type (electron donor) electronically conducting polymeric binder wherein the ionization potentials of the pigment and polymer are estimated to be within 0.2 V. The results also show that thin films of varying thickness of the p-type (electron donor) organic semiconductor dispersion can be conveniently cast onto a solid substrate. The results also show that the thin films exhibit strong absorption of visible and near infrared electromagnetic radiation and hence are suitable for use as photosensitive p-type (electron donor) organic semiconductor compositions for preparing p/n heterojunctions for use in optoelectronic devices such as photodiodes, photodetectors, and photovoltaic (solar cells) cells.

EXAMPLE 3

A photovoltaic cell is prepared by first spin coating a 100 nm thick layer of the p-type TiOpc semiconductor crystal pigment/conducting polymer dispersion described in Example 1 onto a transparent flexible (plastic) support bearing a thin film of indium tin oxide transparent conductor (8 ohm/sq). On a second piece of transparent flexible (plastic) support bearing a thin film of indium tin oxide transparent conductor is coated a 100 nm thick layer of the n-type UD-1 semiconductor crystal pigment/conducting polymer dispersion described in example 3. Each of the coated layers is gently heated under vacuum to remove residual solvent. The two plastic supports thusly coated and dried are pressed together via lamination using a heated roller assembly, with the two plastic supports remaining slightly offset during lamination to allow for electrical connections. The temperature of the rollers is adjusted to a few degrees above the glass transition temperature of the polymers. Electrical connections to the cell are made by contact to the exposed, offset areas of the laminated cell.

EXAMPLE 4

A ball mill (1 gal glass) was charged with 9000 g of ⅛ inch chrome steel beads and 75.0 g of TiOPc containing 1.3 wt % chlorine impurity. The mixture was sheared by milling at about 110 rpm for 7 days at room temperature (about 23° C.). A sample of the resulting pigment was extracted from the beads with water and then dried over night under vacuum at room temperature. 5970 g of the milled pigment with beads was transferred to a 250 ml glass jar, 1305 g of dichloromethane (DCM) was added and the mixture was milled another 24 hours at 117 rpm at room temperature. After this second milling, the pigment/DCM slurry was decanted into a clean 1 gal glass jar. The beads were rinsed 3 times with fresh DCM, and the resulting pigment/DCM was also added to the 1 gal glass jar. The pigment was filtered through a 350 ml medium glass frit under water stream vacuum. The resulting sludge was transferred to petri dishes and dried under vacuum over night at room temperature. The dried pigment was analyzed by XRD and found to be highly crystalline of TiOPc Type V.

To prepare the pigment binder slurry for coating, an attritor milling vessel containing a plastic 50 ml conical tube and a stainless steel stirrer were used. The stirrer consisted of a rotating shaft with 18 small side arms aligned in 4 rows along the lower part of the shaft at 90 degrees to each other and extending perpendicular from the shaft toward the side wall of the vessel. Added to the tube were 46 g of 1.6 mm chrome steel beads, 0.88 g of the milled TiOPc, and 0.22 g of a polyfluorene-arylamine conjugated copolymer P1 [Mw=18,500] dissolved in 12 ml toluene. The polymer was dissolved in the toluene over night under stirring at room temperature and filtered through a 1 micron filter. The mixture was agitated at 1500 rpm for 3 hours. After the 3 hours of wet milling, the plastic tube containing the slurry was removed from the attritor, slurry adhering to the upper walls of the tube was carefully removed, the amount of remaining slurry in the tube determined by weight and enough fresh toluene added to the slurry to result in a 5% total solids concentration of pigment and binder in toluene. After mixing the toluene and slurry by vigorous shaking, the dispersion was separated from the beads through aspiration. Particle size of the TiOPc pigments was estimated based on Scanning Electron Microscopy (SEM) micrographs according to a procedure known to those versed in the art. SEM micrographs were obtained by spin coating the aforementioned dispersion onto a silicon wafer, which served as the sample holder during the SEM measurement. Analysis of such SEM micrographs suggests a primary pigment particle size between 30 and 100 nm, with occasional particles of 200 nm or larger.

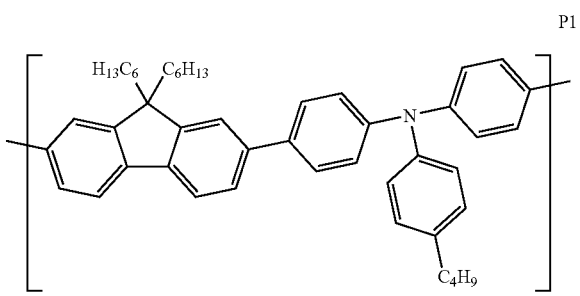

P1

Thin films of the final dispersion were prepared by spin coating using a Headway PWM 32 model spin coater onto precleaned 50 mm×50 mm glass slides. Various rotation speeds were utilized to provide samples of various film thicknesses. UV-vis absorption spectra are measured for the coated slides using a Cary 5E UV-vis-NIR spectrophotometer. The spectra show absorbance in the spectral region of 500 nm to 900 nm that is due to the light absorption by the TiOPc pigment material. Spectral absorption due to polyfluorene-arylamine copolymer is confined to wavelengths under about 400 nm. Film thickness was measured on a Tencor P-10 Surface Profilometer. Literature data indicate the ionization potential of the metal phthalocyanine to be within 0.3 eV of that of the polyfluorene-arylamine copolymer.

The following data Table 4 lists the thickness of the spin-coated layer (in micron mm), and the Absorbance (optical density OD) measured at the absorbance maximum (840-850 nm). The data show that the coated dispersion exhibits a high degree of light absorption in the NIR and visible spectral regions at minimal film thickness.

TABLE 4

| Sample | thickness (in micron μm) | Absorbance (optical density OD) |
| --- | --- | --- |
| 1 | 0.104 | 0.45 |
| 2 | 0.113 | 0.62 |
| 3 | 0.193 | 0.98 |
| 4 | 0.358 | 1.66 |

The results demonstrate the preparation of a photosensitive p-type (electron donating) organic semiconductor composition that comprises nanometer-sized p-type (electron donor) organic semiconductor pigment crystals dispersed in a p-type (electron donor) electronically conducting conjugated polymer binder wherein the ionization potentials of the pigment and polymer are nominally equivalent. The results also show that thin films of varying thickness of the p-type (electron donor) organic semiconductor dispersion can be conveniently cast onto a solid substrate. The results also show that the thin films exhibit strong absorption of visible and neat infrared electromagnetic radiation and hence are suitable for use photosensitive p-type (electron donor) organic semiconductor compostions for preparing p/n heterojunctions for use in optoelectronic devices such as photodiodes, photodetectors, and photovoltaic (solar cells) cells.

The invention has been described in detail with particular reference to certain preferred embodiments thereof but it will be understood that variations and modifications can be effected within the spirit and scope of the invention.

The invention claimed is:

1. A p/n heterojunction comprising a combination of at least one layer comprising p-type organic semiconductor pigment with at least one p-type conducting polymer, wherein the ionization potential of said at least one p-type organic semiconductor pigment and the ionization potential of said at least one p-type conducting polymer are nominally equivalent and at least one layer comprising at least one n-type organic semiconductor pigment with at least one n-type conducting polymer, wherein the electron affinity of said at least one n-type organic semiconductor pigment and the electron affinity of said at least one n-type conducting polymer are nominally equivalent.

2. The p/n heterojunction of claim 1 further comprising a support.

* * * * *